United States Patent
Jacobs et al.

(10) Patent No.: US 7,684,012 B2
(45) Date of Patent: *Mar. 23, 2010

(54) LITHOGRAPHIC DEVICE, DEVICE MANUFACTURING METHOD AND DEVICE MANUFACTURED THEREBY

(75) Inventors: Johannes Henricus Wilhelmus Jacobs, Eindhoven (NL); Vadim Yevgenyevich Banine, Helmond (NL); Barrie Dudley Brewster, Brighton (GB); Vladimir Vitalevitch Ivanov, Moscow (RU); Bastiaan Matthias Mertens, 's-Gravenhage (NL); Johannes Hubertus Josephina Moors, Helmond (NL); Robert Gordon Livesey, Cuckfield (GB); Bastiaan Theodoor Wolschrijn, Abcoude (NL)

(73) Assignee: ASML Netherlands B.V., Veldhoven (NL)

( * ) Notice: Subject to any disclaimer, the term of this patent is extended or adjusted under 35 U.S.C. 154(b) by 111 days.

This patent is subject to a terminal disclaimer.

(21) Appl. No.: 11/391,731

(22) Filed: Mar. 29, 2006

(65) Prior Publication Data

US 2006/0268246 A1 Nov. 30, 2006

Related U.S. Application Data

(63) Continuation-in-part of application No. 11/252,240, filed on Oct. 18, 2005, and a continuation-in-part of application No. 11/091,926, filed on Mar. 29, 2005.

(51) Int. Cl.
*G03B 27/52* (2006.01)
*G03B 27/42* (2006.01)

(52) U.S. Cl. .......................... 355/67; 355/53

(58) Field of Classification Search ............... 355/30, 355/53, 67, 72–76; 378/34, 35; 250/492.2, 250/548

See application file for complete search history.

(56) References Cited

U.S. PATENT DOCUMENTS

| 4,692,934 A | 9/1987 | Forsyth |
| 4,901,668 A | 2/1990 | Murakami ................ 118/722 |
| 5,063,568 A | 11/1991 | Chiba et al. |
| 5,079,112 A | 1/1992 | Berger et al. |
| 5,260,151 A | 11/1993 | Berger et al. |
| 5,305,364 A | 4/1994 | Mochiji et al. |

(Continued)

FOREIGN PATENT DOCUMENTS

EP 0 957 402 A2 11/1999

(Continued)

OTHER PUBLICATIONS

European Search Report issued for European Patent Application No. 06251739.6—2222, dated Dec. 1, 2006.

(Continued)

*Primary Examiner*—Hung Henry Nguyen
(74) *Attorney, Agent, or Firm*—Pillsbury Winthrop Shaw Pittman LLP

(57) ABSTRACT

A lithographic apparatus is configured to project a pattern from a patterning device onto a substrate. The apparatus includes a gas purged sealing aperture extending between at least two different zones of the apparatus, and a gas supplier configured to supply the sealing aperture one or more gases selected from a group including hydrogen, deuterium, heavy hydrogen, deuterated hydrogen, and a mixture of argon and hydrogen.

21 Claims, 2 Drawing Sheets

U.S. PATENT DOCUMENTS

| | | | |
|---|---|---|---|
| 5,559,584 A | 9/1996 | Miyaji et al. | 355/73 |
| 5,696,623 A | 12/1997 | Fujie et al. | 359/350 |
| 5,716,501 A | 2/1998 | Kawashima et al. | 204/192.26 |
| 6,046,792 A | 4/2000 | Van Der Werf et al. | |
| 6,198,792 B1 * | 3/2001 | Kanouff et al. | 378/34 |
| 6,262,796 B1 | 7/2001 | Loopstra et al. | |
| 6,333,775 B1 * | 12/2001 | Haney et al. | 355/30 |
| 6,341,006 B1 * | 1/2002 | Murayama et al. | 355/53 |
| 6,429,440 B1 | 8/2002 | Bleeker | |
| 6,459,472 B1 | 10/2002 | De Jager et al. | |
| 6,642,996 B2 * | 11/2003 | Nogawa | 355/72 |
| 6,683,936 B2 | 1/2004 | Jonkers | |
| 6,731,371 B1 * | 5/2004 | Shiraishi | 355/30 |
| 6,961,113 B1 | 11/2005 | Hayashi et al. | 355/30 |
| 6,970,228 B1 * | 11/2005 | Aoki et al. | 355/30 |
| 2001/0038442 A1 | 11/2001 | Hansell et al. | 355/30 |
| 2002/0057422 A1 | 5/2002 | Arakawa | 355/30 |
| 2002/0145711 A1 | 10/2002 | Magome | 355/30 |
| 2003/0190012 A1 | 10/2003 | Ahmad | 378/119 |
| 2004/0160584 A1 * | 8/2004 | Yamamoto | 355/30 |
| 2004/0240506 A1 | 12/2004 | Sandstrom et al. | |
| 2005/0110966 A1 * | 5/2005 | Hasegawa | 355/30 |
| 2006/0007414 A1 | 1/2006 | Luttikhuis et al. | 355/30 |

FOREIGN PATENT DOCUMENTS

| | | | |
|---|---|---|---|
| EP | 0 957 402 A3 | | 3/2000 |
| EP | 1 098 225 A2 | | 5/2001 |
| EP | 0 532 968 B1 | | 1/2002 |
| EP | 1 229 573 A1 | | 8/2002 |
| EP | 1329772 A2 | | 7/2003 |
| EP | 1 389 747 A2 | | 2/2004 |
| EP | 1429189 | * | 6/2004 |
| EP | 1 596 252 A1 | | 11/2005 |
| WO | WO 97/33205 | | 9/1997 |
| WO | WO 98/28665 | | 7/1998 |
| WO | WO 98/40791 | | 9/1998 |
| WO | WO 01/84241 A1 | | 11/2001 |
| WO | WO 03/087867 A2 | | 10/2003 |
| WO | WO 2005/096099 A2 | | 10/2005 |

OTHER PUBLICATIONS

Singapore Written Opinion issued for Singapore Patent Application No. 200602061-4, dated Sep. 10, 2007.

Office Action issued in U.S. Patent Application No. 11/091,926, dated Dec. 15, 2006.

Office Action issued in U.S. Patent Application No. 11/091,926, dated Jun. 1, 2007.

Official Action issued on Mar. 3, 2008 in U.S. Appl. No. 11/091,926.

* cited by examiner

LITHOGRAPHIC DEVICE, DEVICE MANUFACTURING METHOD AND DEVICE MANUFACTURED THEREBY

CROSS-REFERENCE TO RELATED APPLICATIONS

This application is a continuation-in-part of U.S. patent application Ser. No. 11/091,926, filed Mar. 29, 2005, and U.S. patent application Ser. No. 11/252,240, filed Oct. 18, 2005, the contents of which are both hereby incorporated by reference in their entireties.

FIELD

The invention relates to a lithographic projection apparatus that includes a radiation system for supplying a projection beam of radiation, a mask table for holding a mask, a substrate table for holding a substrate, and a projection system for imaging an irradiated portion of the mask onto a target portion of the substrate.

BACKGROUND

An apparatus of this type can be used, for example, in the manufacture of integrated circuits (ICs). In such a case, the mask (reticle) may contain a circuit pattern corresponding to an individual layer of the IC, and this pattern can then be imaged onto a target area (die) on a substrate (silicon wafer), which has been coated with a layer of photosensitive material (resist). In general, a single wafer will contain a whole network of adjacent dies, which are successively irradiated through the reticle, one at a time. In one type of lithographic projection apparatus, each die is irradiated by exposing the entire reticle pattern onto the die in one go; such an apparatus is commonly referred to as a waferstepper. In an alternative apparatus—which is commonly referred to as a step-and-scan apparatus—each die is irradiated by progressively scanning the reticle pattern under the projection beam in a given reference direction (the "scanning" direction) while synchronously scanning the wafer table parallel or anti-parallel to this direction; since the projection system will have a magnification factor M (generally <1), the speed v at which the wafer table is scanned will be a factor M times that at which the reticle table is scanned. More information with regard to lithographic devices as here described can be gleaned from International Patent Application WO 97/33205.

Up to very recently, apparatus of this type contained a single mask table and a single substrate table. However, machines are now becoming available in which there are at least two independently movable substrate tables; see, for example, the multi-stage apparatus described in International Patent Applications WO 98/28665 and WO 98/40791. The basic operating principle behind such multi-stage apparatus is that, while a first substrate table is underneath the projection system so as to allow exposure of a first substrate located on that table, a second substrate table can run to a loading position, discharge an exposed substrate, pick up a new substrate, perform some initial alignment measurements on the new substrate, and then stand by to transfer this new substrate to the exposure position underneath the projection system as soon as exposure of the first substrate is completed, whence the cycle repeats itself; in this manner, it is possible to achieve a substantially increased machine throughput, which in turn improves the cost of ownership of the machine In currently available lithographic devices, the employed radiation is generally ultra-violet (UV) light, which can be derived from an excimer laser or mercury lamp, for example; many such devices use UV light having a wavelength of 365 nm or 248 nm. However, the rapidly developing electronics industry continually demands lithographic devices which can achieve ever-higher resolutions, and this is forcing the industry toward even shorter-wavelength radiation, particularly UV light with a wavelength of 193 nm or 157 nm. Beyond this point there are several possible scenarios, including the use of in-band extreme UV light (EUV:wavelength~50 nm and less, e.g. 13.4 nm, 13.5nm or 11 nm), X-rays, ion beams or electron beams. All of these so-called next-generation radiations undergo absorption in air, so that it becomes necessary to at least partially evacuate the environment in which they are employed. This introduces considerable problems.

A general discussion of the use of EUV in lithographic projection apparatus can be found, for example, in the article by J. B. Murphy et al. in Applied Optics 32 (24), pp 6920-6929 (1993). Similar discussions with regard to electron-beam lithography can be found in U.S. Pat. No. 5,079,112 and U.S. Pat. No. 5,260,151, as well as in EP-A 98201997.8 (P-0113.000-EP).

The European patent application EP 0 957 402 A2, which is incorporated in the present application by reference, describes a lithographic apparatus, whereby a projection system is separated from a substrate table by an intervening space. The intervening space can at least partially be evacuated. The intervening space contains a hollow tube, which is continually flushed by a flow of gas, to reduce cross-contamination between the substrate table and the projection system. The gas does not substantially absorb EUV radiation. According to EP 0 957 402 A2, the gas is Ar or Kr. During use, radiation is directed through the tube, from the projection system to a substrate which is held by the substrate table. An advantage of the use of argon is that the 'removability' or 'pumpability' of argon is relatively good. For instance, in typical vacuum pumps used in lithographic apparatus, such as turbomolecular pumps, the pumping speed for argon (relative molecular mass 40) is relatively large compared to the pumping speed for very light gases, such as hydrogen (relative molecular mass 2), or very heavy gases like Xenon (relative molecular mass 131).

International application WO 01/84241 A1, which is also incorporated herein by reference, describes a lithographic apparatus and method, comprising a non-contact seal using a purge gas. Therein, a purged optical path between an optical source surface and an optical target surface is provided, as well as relative movement between the optical source surface and the optical target surface. A purge gas of a controlled purity is used.

SUMMARY

It is an object of the invention to improve a lithographic projection apparatus as stated in the opening paragraph, which apparatus is compatible for use in a vacuum or semi-vacuum environment. In particular, it is an object of the invention that such an apparatus should be compatible with the use of radiation comprising EUV, charged particles or X-rays. More specifically, it is an object of the invention that such an apparatus should not suffer from significant "down-time" due to decrease of operational performance caused by degeneration of the projection system. A further object of the invention is to provide at least one seal for sealing different apparatus zones from each other, this seal helping to prevent cross-contamination between the zones.

The basic apparatus to achieve these objects comprises an apparatus that includes a radiation system for supplying a projection beam of radiation, a mask table for holding a mask, a substrate table for holding a substrate, and a projection system for imaging an irradiated portion of the mask onto a target portion of the substrate. The apparatus also includes the features of:

a) the projection system is separated from the substrate table by an intervening space which can be at least partially evacuated and which is delimited at the location of the projection system by a solid surface from which the employed radiation is directed toward the substrate table;

b) the intervening space contains a hollow tube located between the said solid surface and the substrate table and situated around the path of the radiation, the form and size of the tube being such that radiation focused by the projection system onto the substrate table does not intercept a wall of the hollow tube;

c) a flushing device is provided for continually flushing the inside of the hollow tube with a flow of gas.

This is known as a dynamic gas lock and is described, for example, in U.S. Pat. No. 6,459,472 B1. Further features that improve the apparatus are described below.

The "solid surface" referred to under point (a) is, for example, the final mirror in the projection system from which the radiation is directed toward the substrate, or a (thin) optical flat (i.e. optical window) comprised of a vitreous material. The term vitreous should here be interpreted as encompassing such materials as silicates, quartz, various transparent oxides and fluorides (such as magnesium fluoride, for example) and other refractories.

In experiments leading to the invention, the inventors built a prototype device in which the radiation system delivered EUV (with a wavelength of approx. 13.4 nm). A projection system (comprising various mirrors) was used to focus the laser radiation onto a substrate table, onto which a test wafer could be mounted. A substantially evacuated enclosure, delimited (bounded) at one end by the exit aperture of the laser and at the other end by the substrate table, was provided around the projection system, so that the path of the radiation from source to substrate was substantially airless, including therefore the intervening space between the projection system and the substrate table. This intervening space was delimited on the side facing the substrate table by the last mirror in the projection system (the "solid surface" referred to hereabove). Such evacuation was necessary because of the fact that EUV undergoes significant absorption in air, and was aimed at avoiding substantial light-loss at substrate level.

In working with this prototype system, the inventors observed rapid degeneration of the resolution and definition of fine (submicron-sized) images projected onto a resist-coated wafer on the substrate table. Many different possible sources of this problem were sought and investigated before the inventors finally observed that the final optical surface (mirror) in the projection system had become unacceptably contaminated. Further analysis demonstrated that this contamination was caused by the presence of a spurious coating of organic material, which was subsequently identified as consisting of debris and bye-products from the resist layer on the wafer. Evidently, such material was being "sputtered" loose from the wafer by the EUV beam, and the evacuated intervening space between the wafer and the projection system allowed the released material to migrate toward the projection system (and other vicinal surfaces) without undergoing substantial scattering or deflection. Once arrived at the projection system, the material was adsorbed onto the highly accurate optical surfaces of the system, causing the said optical surface degradation.

In an effort to combat this problem, the inventors increased the distance between the substrate table and the projection system, but rapid contamination of the final optical surface of the projection system was still observed. Subsequent calculations (see "Resist Contaminants" below) revealed that such an approach was in fact doomed to be unsatisfactory, and that a more radical anti-contamination measure was required. Eventually, after trying various other approaches, the inventors arrived at the solution described in steps (b) and (c) above. In the inventive solution, the flush of gas prevents resist debris from reaching the projection system in the first place.

The gas employed in the flush should be a substance that does not substantially absorb the radiation in the projection beam (e.g. EUV), while having a substantially low diffusion coefficient for contaminants. Examples of such gases that have been used in dynamic gas locks are Ar and Kr.

According to a first aspect of the present invention, there is therefore provided a lithographic apparatus configured to project a pattern from a patterning device onto a substrate, the lithographic apparatus comprising at least one gas purged sealing aperture extending between different zones of the apparatus, wherein the apparatus comprises at least one supplier which is configured to supply a light gas to the sealing aperture.

In an embodiment, a lithographic apparatus is configured to project a pattern from a patterning device onto a substrate. The apparatus includes a gas purged sealing aperture extending between at least two different zones of the apparatus, and a gas supplier configured to supply the sealing aperture one or more gases selected from a group comprising hydrogen, deuterium, heavy hydrogen, deuterated hydrogen, and a mixture of argon and hydrogen.

A dynamic gas lock that uses gases such as Ar is described in U.S. Pat. No. 6,198,792 B1, which describes a hole in a membrane, the membrane separating the projection system area from the substrate area, the hole being for allowing the projected radiation to impinge on the substrate. The inert gas flows across the transmission direction of the radiation beam.

A dynamic gas lock which describes a flow going in the same direction as the projected radiation, which further has a membrane or window through which the projected radiation must be transmitted is described in U.S. Pat. No. 6,683,936 B2, U.S. Pat. No. 6,642,996 B2 and EP 0 532 968 A1. The hollow tube of these latter documents that directs the inert gas may be cone-shaped and is covered at its top end by a membrane through which the radiation must travel before impinging on the substrate. The membrane prevents the inert gas from flowing upwards towards the projection system.

The problem with having a membrane to prevent upward flow of the inert gas is that the amount of projected radiation going through the membrane is inevitably absorbed or deflected. A typical loss is as much as half of the EUV radiation intensity. A problem with using heavy gases such as Ar is that a greater pressure is required to create a desired flow of heavier gases because of the greater mass to move.

The present invention seeks to prevent the loss of EUV radiation, while optimizing the benefits of a dynamic gas lock.

The apparatus of the present invention may comprise a hollow tube having the form of a cone, which tapers inwards in a direction extending from the said solid surface towards the substrate table. Seeing as the projection system serves to focus an image onto the substrate, the radiation emerging from the projection system will taper inwards toward the final image on the wafer. If the employed hollow tube is of a conical form that imitates this said tapering, then the tube will have the minimal volume necessary to encapsulate the said emergent radiation. This is advantageous because it minimizes the flow of gas required to produce an effective flush, leading to materials savings; in addition, the gas load to the system is reduced.

The gas may be introduced into the hollow tube via at least one opening in a wall of the tube. Alternatively, the gas can, for example, be introduced over a top rim of the tube. In a particular version of the former embodiment, the opening is a region that is porous to the employed gas.

The flush of gas in the hollow tube may be at least partially directed towards the substrate table. The very presence of gas at all (whether static or dynamic) between the substrate and the projection system provides a scattering barrier to debris migrating from the substrate. However, if such gas is additionally directed toward the substrate, then this provides an additional safeguard against such debris reaching the projection system. It should be noted that the flush need not be directed in its entirety towards the substrate: for example, if the gas is introduced via an opening in the wall of the tube located at some point (e.g. half way) between its upper and lower limits (rims), then some of the gas can flow from the hole upwards (toward the projection system) and the rest can flow downwards (toward the substrate).

A dynamic gas lock may be provided as described above, wherein the gas used is hydrogen, heavy hydrogen or deuterium, deuterated hydrogen, or another light gas.

The dynamic gas lock may have no member separating the intervening space from the space including the hollow tube, and the hollow tube may contain a region in which flow of contaminants issuing from the substrate and a flow of the gas are opposed.

The solid surface may be a reflecting surface and the optic path from this reflecting surface to the target portion of the substrate held in the substrate table may traverse only fluid; i.e. there may be no member separating the intervening space from the space including the hollow member.

The second embodiment is based on the inventive notion that a purge gas mixture comprising at least argon and hydrogen provides an extra good sealing effect of the sealing aperture, compared to the use of argon alone. Following from the invention, a suitably chosen mixture of argon and hydrogen provides a relatively high figure of merit concerning the sealing of the aperture, whereas this mixture is relatively easy to pump from the apparatus, compared to the use of pure argon. Besides, by using a mixture of hydrogen and argon, thermal conductivity of the sealing gas is increased. Also, ionisation effects that could emanate from the use of pure argon can be potentially quenched by the present invention. When the gas flow into the system is chosen to achieve a particular level of sealing performance, a suitably-chosen mixture of argon and hydrogen can cause lower absorption of illumination energy than either argon or hydrogen alone.

Similarly, in vacuum applications where argon may be considered, a mixture of hydrogen and argon may be advantageously used because of the quenching effect of the hydrogen. Such applications include gas curtains to reduce contamination, use of a background level of an inert gas within a vacuum chamber, and use of an inert gas for purging.

The invention is also based upon the inventive idea that neither the use of pure argon as a sealing gas, nor the use of pure hydrogen is advantageous. According to the invention, a suitable mixture of argon and hydrogen may be used, which combines the advantages of the use of pure hydrogen and argon and diminishes the disadvantages thereof. Surprisingly, this mixture provides an improved reduction of cross-contamination, for instance of moisture and hydrocarbons, whereas the mixture can be removed from the apparatus relatively easily and effectively, for instance by one or more turbomolecular pumps, even when using relatively high supply rates of the hydrogen and argon. For instance, as a non-limiting example, for a typical turbomolecular pump, the pumping speed for argon is about 2800 liters/s, while the corresponding pumping speed for hydrogen is only about 1800 liters/s. To a good approximation, the pumping speed of a 50%/50% mixture of the two gases will be halfway between, i.e. about 2300 liters/s.

The invention can be explained by the following inventive notions. Firstly, the performance of the sealing arrangement depends, amongst others, on the type of sealing gas used, and the flow rate of the gas. Also, a sealing gas species has molecules with a characteristic mass and collision cross-section with a contaminating species, which is to be blocked or removed, for instance, by the sealing gas species. The characteristic mass and collision cross-section, as well as said flow rate, determine the effectiveness of the sealing gas for suppressing a contaminant flow. This effectiveness may be quantified for each gas by a diffusion constant $D_c$.

Secondly, following from the present invention, the more gas is used for sealing said aperture, the more radiation, for instance EUV radiation, may be absorbed by that gas at a given pump capacity. For instance, excessive gas flow may lead to an undesired attenuation of EUV projection radiation.

Therefore, following from the present invention, a figure of merit Fm of a sealing gas species may be calculated as $F_m = 1/(22.5 \cdot \alpha \cdot D_c)$. It follows, according to the present invention, that argon has a relatively low figure of merit concerning the sealing of the aperture. Hydrogen has a relatively high figure of merit, at least higher than that of argon when a projection beam having a small wavelength, for instance an EUV beam.

However, hydrogen has a relatively low molecular mass. Therefore, hydrogen is relatively difficult to remove from the apparatus, compared to argon, for instance when using one or more turbomolecular pumps having low compression ratio at low molecular mass. The low molecular mass of hydrogen, however, does lead to smaller conductance losses for gas flow within the apparatus.

Thus, a suitable mixture of hydrogen and argon is used as a sealing fluid, which mixture provides a better sealing than argon by itself at a given absorption ratio, which mixture can be removed better than hydrogen by itself. Until the present invention, no one has come up with the idea to use a mixture of argon and hydrogen as a sealing gas mixture. Preferably, the mixture contains such an amount of argon and that the mixture contains as much hydrogen as possible, wherein the possibility of explosion of the hydrogen is still prevented.

According to a further embodiment of the invention, there is provided a device manufacturing method comprising projecting a patterned beam of radiation onto a substrate in a lithographic apparatus, wherein at least two zones of the apparatus are sealed from each other by at least one gas purged sealing aperture, characterised in that the method further comprises purging said sealing aperture by at least one of hydrogen, helium, deuterated hydrogen, deuterium or heavy hydrogen or a mixture of at least argon and hydrogen.

In an embodiment, a device manufacturing method is provided. The method comprises projecting a patterned beam of radiation onto a substrate in a lithographic apparatus; sealing at least two zones of the apparatus from each other with at least one sealing aperture; and purging said sealing aperture with at least one gas selected from the group comprising hydrogen, helium, deuterated hydrogen, deuterium, heavy hydrogen, and a mixture of argon and hydrogen.

According to a further embodiment of the invention, there is provided a seal for a lithographic apparatus comprising a gas purged sealing aperture extending between two zones of the apparatus, wherein the seal is provided with at least one supplier which is configured to supply a light gas to the sealing aperture.

According to an embodiment, there is provided a seal for a lithographic apparatus comprising a gas purged sealing aperture extending between two zones of the apparatus, wherein the seal is provided with at least one gas supplier configured to supply the sealing aperture with at least one gas from a group comprising hydrogen, heavy hydrogen, deuterium, deuterated hydrogen, and a mixture of argon and hydrogen.

A further embodiment of the invention provides the use of at least one of: hydrogen, helium, deuterated hydrogen, deuterium or heavy hydrogen and a mixture containing substantially hydrogen and argon for flushing a sealing aperture of a lithographic projection apparatus.

According to a further embodiment of the invention, there is provided a computer program containing one or more sequences of machine-readable instructions describing a method described above and a data storage medium having such a computer program stored therein.

In a manufacturing process using a lithographic projection apparatus according to the invention, a pattern in a mask is imaged onto a substrate, which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference has been made hereabove to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

Although the discussion in this text concentrates somewhat on the use of EUV, it should be explicitly noted that the invention is also applicable in systems employing other radiation types. For example, in the case of a lithographic apparatus employing UV light in combination with a (partially) evacuated environment—aimed, for example, at reducing substrate contamination—the current invention combats the built-up of resist debris on the UV projection optics. Similarly, in the case of electron or ion beam lithography, the present invention combats the build-up of substrate-produced contaminants on field-lens electrodes. In all cases, the present invention also combats the migration of debris from the substrate to the mask, radiation source, etc.

BRIEF DESCRIPTION OF THE DRAWINGS

The invention and its attendant advantages will be further elucidated with the aid of exemplary embodiments and the accompanying schematic drawings, whereby.

In the Figures, like reference symbols denote corresponding features.

DETAILED DESCRIPTION

Overview of Apparatus

Figure 1:
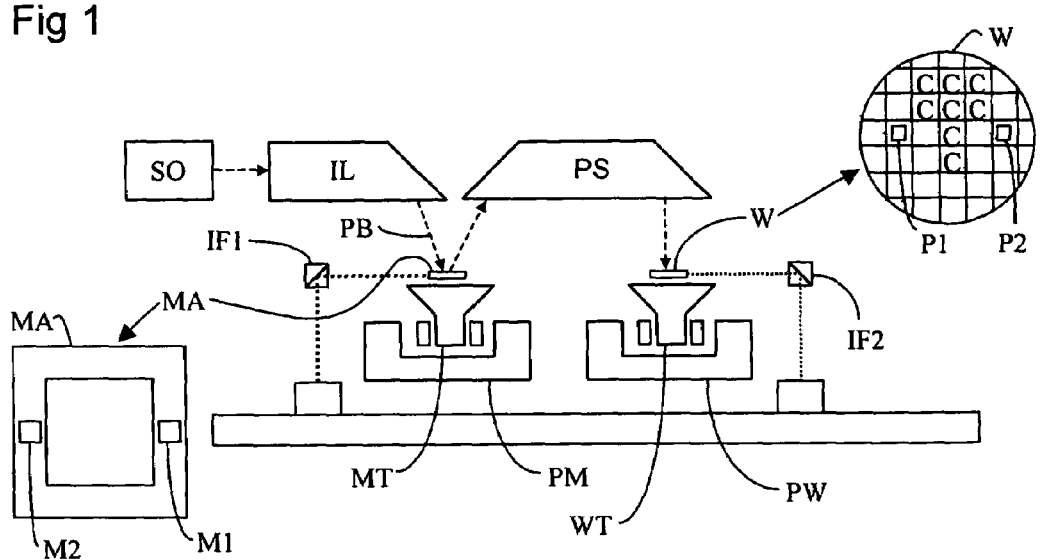
FIG. 1 depicts a schematic view of a lithographic projection apparatus.

FIG. 1 renders a schematic perspective view of a lithographic projection apparatus suitable for use with the current invention. The apparatus comprises: a radiation system SO, IL for supplying a projection beam PB of radiation (e.g. EUV light with a wavelength in the range 10-15 nm, or a flux of electrons, ions or X-rays); a mask table MT, for holding and positioning a mask MA (e.g. a reticle); a substrate table WT, for holding and positioning a substrate W (e.g. a resist-coated silicon wafer); and a projection system PS (e.g. a reflective system (mirror group) or a field lens) for imaging an irradiated portion of the mask MA onto a target portion C (die) of the substrate W.

The radiation system comprises a source SO (e.g. a synchrotron, undulator or laser, or a charged particle or X-ray source) which produces a beam of radiation. This beam is passed through the beam shaping system IL, so that the resultant beam PB is substantially collimated and uniformly intense throughout its cross-section.

The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The beam PB subsequently intercepts the mask MA which is held in a mask holder on a mask table MT. From the mask MA, the beam PB passes through the projection system PL, which focuses the beam PB onto a target area C of the substrate W.

With the aid of the second positioner PW and position sensor IF2 (e.g. an interferometric device, linear encoder or capacitive sensor), the substrate table WT can be moved accurately, e.g. so as to position different target portions C in the path of the radiation beam PB. Similarly, the first positioner PM and another position sensor IF1 can be used to accurately position the mask MA with respect to the path of the radiation beam PB, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus can be used in two different modes:

1. In step mode, the mask table MT is fixed, and an entire mask image is projected in one go (i.e. a single "flash") onto a target area C. The substrate table WT is then shifted in the x and/or y directions so that a different target area C can be irradiated by the (stationary) beam PB;

2. In scan mode, essentially the same scenario applies, except that a given target area C is not exposed in a single "flash". Instead, the mask table MT is movable in a given direction (the so-called "scan direction", e.g. the x direction) with a speed v, so that the projection beam PB is caused to scan over a mask image; concurrently, the substrate table WT is simultaneously moved in the same or opposite direction at a speed V=Mv, in which M is the magnification of the projection system PS (e.g. M=¼ or ⅕). In this manner, a relatively large target area C can be exposed, without having to compromise on resolution.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

If the projection beam PB comprises radiation such as EUV, charged particles or X-rays, it will generally be necessary to at least partially evacuate the depicted apparatus, at least along the path of the beam PB from the source SO to the wafer W. Such evacuation has the disadvantage that it allows the migration of resist debris from the wafer W over relatively long distances, and particularly into the projection system PL, whence such debris can accumulate on optical surfaces (e.g. mirrors) and cause serious degradation of their quality.

It is known to provide a window or translucent membrane to separate the substrate from the optical surfaces of the projection system in order to prevent debris from accumulating on those optical surfaces. However, debris accumulates on the membrane instead; and the radiation is attenuated by the same membrane, so the problem is not really solved in this way.

This problem may be solved using the current invention, for example as described in the embodiments described later.

Resist Contaminants

Resist contamination as hereabove described can be divided in two parts: solvents and exposure products. The solvents are necessary for spinning the resist onto the wafer, but after baking for a few hours at temperatures of the order of 160-175° C., for example, they will generally have evaporated. It is not very likely that complete molecules of the resist will evaporate during exposure, because the molecular mass is too high. However, it is possible that parts of the resist molecules evaporate after they have been cracked by the beam during exposure.

When resist is illuminated by energetic radiation, the long chains of resist molecules can interconnect or break depending on the type of resist used: negative or positive resist. In the case of breaking, short chains of organic material will be created, and these may evaporate from the resist. In a vacuum system, these particles can travel through the system freely and reach those optical elements of the projection system which are "visible" from the illuminated wafer, even though the distance between resist and optics can be quite large (e.g. about 0.5 meter). Carbon-and oxide-containing molecules will adsorb relatively easily onto the mirror surfaces.

The mean free path of the contamination molecules is:

$$\lambda = (k_B T)/(\sqrt{2} p \pi d^2) \quad (1)$$

where:

$k_B$=Boltzmann constant [$1.38 \times 10^{-23}$ J/K]
T=temperature of gas [e.g. 300 K]
p=pressure of background gas inside the camera [Pa], and
d=effective diameter of a contamination molecule.

On average, a debris molecule can reach a surface at 0.5 m without scattering if the environmental pressure is lower than $3 \times 10^{-4}$ mbar. This pressure is equal to, or even higher than, the pressure in an EUV system, so that we may assume that the debris molecules will reach the last projection-system mirror without obstruction. The contamination molecules are assumed to be emitted with a $\cos(\theta)$ angular distribution. Therefore, at least all molecules that are emitted within a solid angle the same as that of the EUV beam will reach the last mirror. For NA (numeric aperture) =0.1, this fraction of the total yield is:

$$1/\pi \int_0^{2\pi} \int_0^{\alpha} \cos(\theta)\sin(\theta) d\theta d\phi \approx 1\% \quad (2)$$

where $\alpha$ is the half opening angle of the EUV beam [NA0.1⇒α~5.5°]. A fraction of these molecules reaching the last mirror will be adsorbed. The result of this adsorption can be a decrease of the mirror's reflectivity and/or a degradation of its surface smoothness, which results in enhanced scattering of the EUV light.

The Total Integrated Scatter (TIS) is of the order of $(4\pi\sigma/\lambda^2)$, where $\sigma$ is the RMS surface roughness and $\lambda$ is the wavelength of the incident light. Allowing a TIS due to surface roughness of the order of 1%, we obtain a maximum acceptable RMS surface roughness of the order of 0.1 nm. In the assumption that 50 % of this roughness is due to contamination adsorption, one obtains:

$$\text{contamination-induced roughness } (RMS)=0.05 \text{ } nm = (\Sigma \Delta z^2/N)^{1/2} = \sqrt{(f \Delta z^2)} \quad (3)$$

where:

$\Delta z$=effective thickness of adsorbed contamination
$\Sigma$=summation over particles in illuminated footprint on mirror N=number of monolayer particles in illuminated footprint on mirror, and F=fractional monolayer coverage.

In the assumption that the diameter of an adsorbed molecule is of the order of 0.25 nm (e.g. 0.23 nm for $CO_2$), it can be calculated that the maximum allowed fractional monolayer coverage is about 5%. In other words, after deposition of 0.05 monolayer of contamination, the optics do not comply with roughness requirements anymore. This implies a permitted maximum of $10^{14}$ adsorbed debris molecules/cm$^2$ inside the EUV footprint of the beam on the last mirror of a projection system (e.g. a "Jewell-type" projection system as described in U.S. Pat. No. 5,063,568).

In order to calculate the time it takes before the maximum allowed debris layer is deposited onto the exposed mirror, one has to know the flux of debris due to the 13.4 nm bombardment. The photodesorption yield of neutrals emitted after irradiation by EUV with λ=13.4 nmEUV(92.7 eV) or 11 nm(109 eV) can be estimated from measurements of the yield after impact of 4.9 eV photons (254 nm radiation) or 25 eV electrons [see G. Hiraoka, IBM Journal of Research and Development, 1977, pp 121-130]. This is done assuming that the yield over this small energy range scales purely with excitation energy and is independent of the type of excitation [G.D. Kubiak et al., J. Vac. Sci. Technol. B 10(6), 1992, pp 2593-2599]. From the data presented in Table 1 (obtained from the above-mentioned Hiraoka article) we infer that, for PMMA resist, of the order of one hydrocarbon molecule (disregarding the $CO_2$ production) is released per incident photon of 100 eV. If we assume a PMMA sensitivity to 13.4-nm radiation of 75 mJ/cm$^2$, we find from the tabulated data that the total photodesorption yield per exposure with EUV radiation is of the order of $5 \times 10^{15}$ molecules/cm for PMMA. For AZ.PN 114 resist, this should be two orders of magnitude less. Dedicated EUV resists are being developed by several manufacturers. Outgassing to some degree is expected.

If 40% of the area of a 300 mm wafer is exposed, the produced hydrocarbon amount is of the order of $10^{18}$ molecules/wafer for PMMA and $10^{16}$ molecules/wafer for AZ.PN 114. Above, it has already been shown that 1 % of these hydrocarbon molecules retraces the optical path and coats the last mirror. The footprint on the last mirror is $\sim 100^2$ cm, which implies that, per illuminated wafer using PMMA resist, $10^{14}$ debris molecules/cm$^2$ will hit the exposed mirror. In other words, assuming all molecules stick, after exposure of only one wafer the debris coverage of the last mirror already exceeds the maximum allowed value.

TABLE 1

Contamination from PMMA resist due to radiation and electron bombardment

| Product | Quantum efficiency (%) of UV photolysis at 254 nm and T = 297 K | Yield for 25-eV electron beam exposure [molec./100 eV] |
|---|---|---|
| $CH_3^\bullet + CH_4$ | 0.8 | not measured |
| CO | 0.7 | not measured |
| CHO | not measured | not measured |
| $CH_3O^\bullet + CH_3OH$ | 0.9 | 0.01 |
| $CH_3CH=CH_2$ | none | 0.08 |
| $CO_2$ | 0.8 | 0.18 |
| $(CH3)_2C=CH_2$ | none | 0.08 |
| $HCOOCH_3$ | none | 0.004 |
| $(CH_3)_2CHCO_2CH_3$ | none | 0.02 |
| $(CH_3)_3CO_2CH_3$ | none | 0.01 |

TABLE 1-continued

Contamination from PMMA resist due to radiation and electron bombardment

| Product | Quantum efficiency (%) of UV photolysis at 254 nm and T = 297 K | Yield for 25-eV electron beam exposure [molec./100 eV] |
|---|---|---|
| $CH_3C(=CH_2)CO_2CH_3$ | not measured | 0.22 |
| $M''/M''_o$* | not measured | 0.79 |

*Monomeric compounds such as methyl methacrylate, methyl pivalate, and methyl isobutyrate.

Although the above calculation is only a rough approximation, it is clear that the demonstrated contamination cannot be tolerated. Therefore, methods should be developed to increase the lifetime of the optical elements.

EMBODIMENTS 1 and 2

Table 2 below relates to the use of a gas flush according to the invention, and shows calculated pressure distributions and contamination distributions for various amounts and positions of gas introduction. The background pressure is 2.5 Pa. The gas loads are given per steradian; therefore, the actual gas load on the system is $2\pi$ larger.

TABLE 2

Suppression of debris due to gas flow in tube.

| Gas load [mbar · l/s] | Introduction height above wafer [cm] | Suppression factor of debris (fraction debris in buffer gas) |
|---|---|---|
| 3.17 | 3 | $10^{-8}$ |
| 5.34 | 3 | $<10^{-12}$ |
| 6.97 | 3 | $<10^{-12}$ |
| 3.25 | 6 | $10^{-4}$ |
| 5.65 | 6 | $10^{-8}$ |
| 6.98 | 6 | $10^{-10}$ |

The above figures were obtained using Computer Fluid Dynamics calculations. The lowest background pressure in these calculations to ensure reliable results is 2.5 Pa. However, in an actual system, the pressure may be lower.

The efficiency and the gas path both increase with increasing height of gas introduction above the wafer, for constant gas pressure at the entrance position. This is because, in general, only gas flowing toward the wafer is sufficiently effective in preventing debris from entering the (vacuum) enclosure in which the projection system is located, and such prevention occurs over a larger distance when the gas is introduced at a higher position. The change of absorption resulting from the change of gas path is not very significant. The absorption is less than 10% for all but the highest introduction points.

A reasonable result is achieved for 35 Pa gas pressure at an introduction point which is about 50 mm above the wafer, corresponding to 30 mm into the tube, since a final distance between the wafer and the bottom of the tube of 20 mm is assumed. At that working point, a debris suppression efficiency of $10^{11}$ is possible (increasing the average time-lapse between having to clean the optics by four orders of magnitude, or more) with only 9 % EUV light absorption.

Generally, for the same absorption of EUV, the stopping efficiency of both $H_2$ and Ar are comparable. However, the configuration of the complete system does not allow sufficient pressure of heavy gases such as Ar throughout the system. Lighter gases such as $H_2$, D, HD and He do not pose such a problem. This is because a larger amount of lighter gas can be pumped through the same opening in a molecular regime than a heavier gas. Molecule velocities are directly proportional to the square root of the mass of the molecules. In other words, light gases are easier to pump at the acceptable pressure level for the system.

According to the above-mentioned state of the art, it would not be obvious to use lighter elements such as hydrogen or helium because heavier gases are more likely to firstly flow in the correct direction and secondly intercept the contamination molecules that are being issued from the substrate.

EMBODIMENT 1

Figure 2:
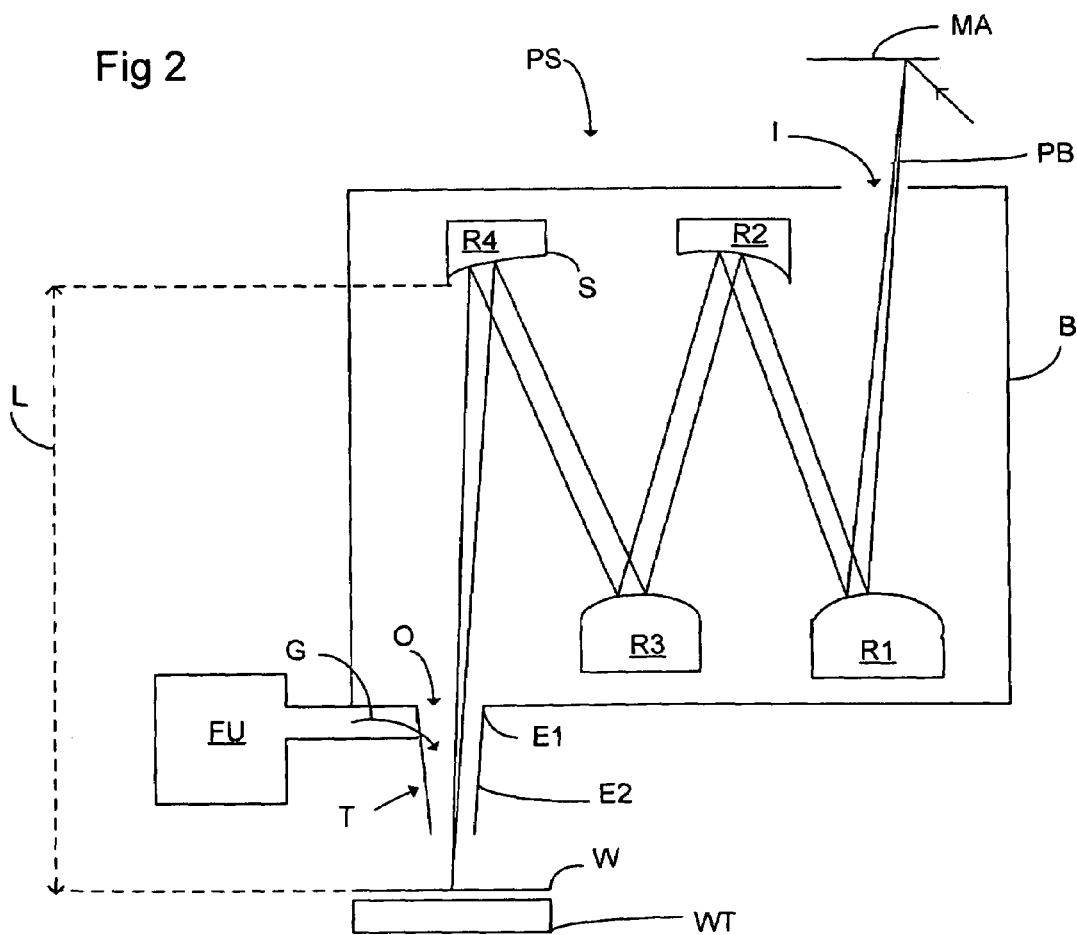
FIG. 2 depicts a cross-sectional view of part of an apparatus as depicted in FIG. 1.

FIG. 2 shows part of an apparatus as depicted in FIG. 1, and demonstrates how the first embodiment of current invention can be applied therein.

The projection beam PB coming (e.g. reflected) from the mask MA passes through the projection system PS before impinging on the substrate W located on the substrate table WT. In this case, the projection system PS comprises four reflectors (mirrors) $R_1$, $R_2$, $R_3$, $R_4$, which serve to focus the beam PB according to given specifications. In this particular instance, the projection system PS is located in an enclosure B, which is provided with an entrance aperture I and an exit aperture O to allow entrance and exit of the beam PB. Although the presence of the enclosure B helps to prevent the accumulation of resist debris on the surfaces of the mirrors $R_1$-$R_4$, it is still possible for reduced quantities of such debris to reach these mirrors, e.g. via the aperture O. There is, however, no membrane or window covering the aperture O. Although a membrane or window might prevent debris from the substrate going up in to the enclosure B, a membrane attenuates large amounts of the projected beam, which would give a further potential area for error in the projection beam intensity and also require a greater starting intensity for the light source supplying the radiation beam. Furthermore, the membrane or window would accumulate debris itself, reducing its transparency to the radiation beam.

The projection system PS is separated from the substrate table WT by an intervening space L. This space L is delimited at the location of the projection system PS by the solid reflecting surface S of the "final" mirror $R_4$ in the system PS. It is noted that it is from the mirror $R_4$ that radiation is finally directed toward the substrate W.

The space L contains a hollow tube T, which is positioned around the path of the radiation beam PB on its way from the surface S to the substrate table WT. This tube T is thus formed, sized and positioned so that its walls do not intercept the beam PB. In this particular case, the tube T is embodied as a continuation of the enclosure B, projecting outward from the exit aperture O. Moreover, as here depicted, the tube T tapers in the direction of the substrate table WT.

According to the first embodiment of the invention, the tube T contains a gas G which does not substantially absorb EUV, e.g. $H_2$, He, Ar or Kr. Preferably, this gas is flushed through the tube T in the direction of the substrate W. This can be achieved, for example, by introducing a downward flow of the gas G from a flushing device FU into the tube T in proximity to its top rim ($E_1$) or at some point ($E_2$) between its top and bottom rims; in the case of introduction at such a latter intermediate point ($E_2$), part of the flow may be downward and part may be upward, for example. The advantage of using smaller molecules like $H_2$ is that the gas is more likely to fit through the porous opening through which the gas is to be introduced into the hollow tube.

The hollow tube is in fluidic communication with space B. This is in order to allow the radiation beam PB to reach the substrate without being attenuated by an extra window or membrane at the top end of the hollow tube. This allows greater accuracy in the final intensity of the beam PB. However, the inert gas G may be angled in such a way as to ensure that the inert gas flows in a direction which is most suitable for eliminating contamination of the projection system (e.g. $R_4$) by contaminants from the substrate surface W. At least a region of the inert gas flow therefore flows in the opposite direction to the flow of the contaminants from the substrate surface, i.e. downwards towards the substrate surface W. For example, rifling may be used in the tube, forcing the gas flow downwards and therefore the contaminant flow outwards away from the hollow tube.

A further advantage of using a light molecule rather than Ar, for instance, is that it reacts more favorably to being ionized by the EUV radiation (or other radiation used). Ar will etch mirror surfaces and decrease the mirror lifetime, whereas He, HD, D and $H_2$ etch very little if at all because the molecule size is smaller.

Furthermore, an advantage of using $H_2$ or its isotopes is that it can form hydrogen radicals or active $H_2$ molecules or other active species when illuminated by EUV radiation (for example), which can counteract hydrocarbon or Sn contamination in situ by reacting with the contaminants and carrying them along in the gas flow.

EMBODIMENT 2

Figure 3:
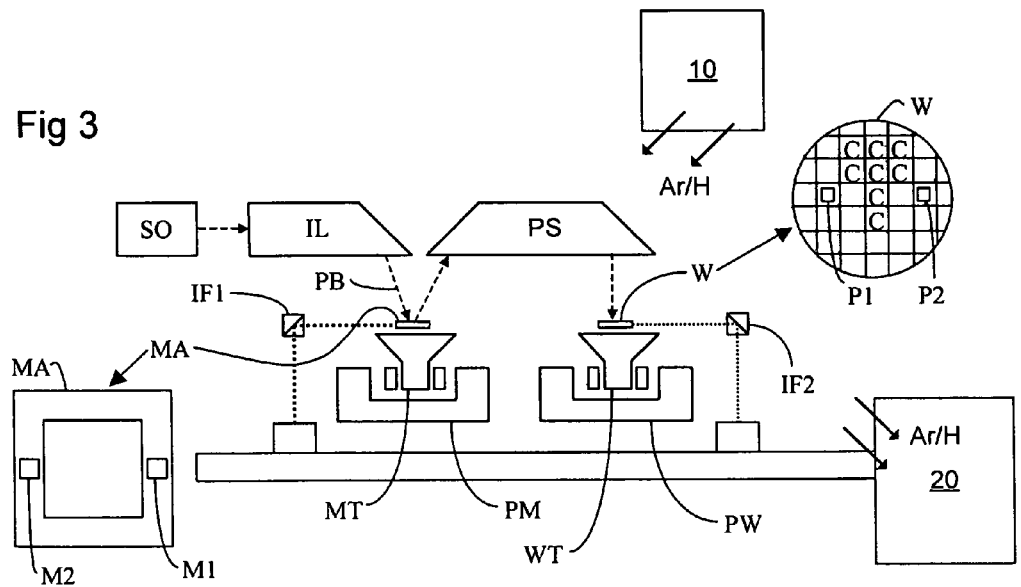
FIG. 3 depicts a second schematic view of a lithographic projection apparatus.

FIG. 3 further schematically shows the apparatus of FIG. 1 adapted to comprise a gas supply system, or gas supplier, 10 for supplying a mixture of argon (Ar) and hydrogen (H) to the apparatus. Also schematically depicted is a pumping system 20, comprising one or more gas pumps, for removing the gasses at least partially from the apparatus. The gas supply system 10 is configured to supply a mixture of at least argon and hydrogen to a sealing aperture of the apparatus, to provide a gas purged sealing aperture. The sealing aperture is not specifically shown in FIG. 1, for clarity. The sealing aperture serves for sealing different zones of the apparatus from each other using said argon and hydrogen mixture.

Figure 4:
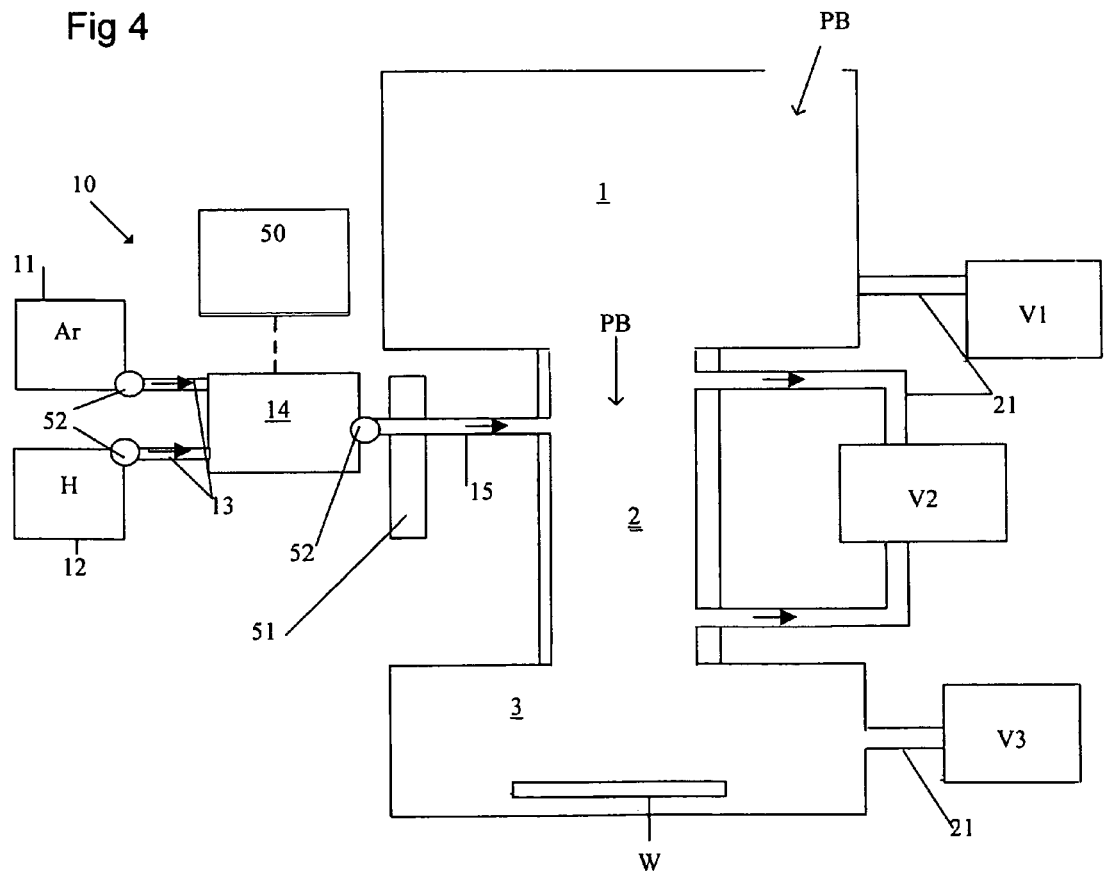
FIG. 4 depicts a cross-sectional view of a part of an apparatus as depicted in FIG. 2.

FIG. 4 schematically depicts a further example of an embodiment of the invention, comprising a gas purged sealing aperture 2 that extends between two neighbouring zones 1, 3. In FIG. 4, the sealing aperture 2 is a fluid passage that extends between two substantially separated zones 1, 3 of the apparatus. The sealing aperture can also be referred to a dynamic gas lock, a dynamic gas seal, or the like. Each sealing aperture may have various dimensions, orientations and forms.

The apparatus may comprise various gas purged sealing apertures 2, each of which may extend between various zones of the apparatus. One or more of the gas purged sealing apertures may be used, for instance, for transmitting said projection beam of radiation between parts of the apparatus, such as disclosed in said European patent application EP 0 957 402 A2. Also, the gas purged sealing aperture 2 may be used as part of a vibration isolator sealing assembly, such as or similar to the sealing assembly as is described in the U.S. Pat. No. 6,333,775, which is incorporated herein by reference, or to the arrangement disclosed by said international application WO 01/84241 A1. Furthermore, a source zone, including the above-mentioned radiation source SO, may be sealed by one or more sealing apertures according to the invention. For example, the sealing aperture can extend between an optics zone, including projection optics, the projection system PS, and an illuminator zone, including the illuminator IL; or the sealing aperture can extend between a source zone, including said radiation source SO, and an illuminator zone, including said illuminator IL.

For example, the sealing aperture 2 may extend between apparatus regions that are chosen from the following:

an illumination zone for an illumination system which is configured to condition a radiation beam;

a patterning device zone for the support which is constructed to support the patterning device MA, the patterning device MA being capable of imparting the radiation beam with a pattern in its cross-section to form a patterned radiation beam PB;

a substrate zone 3 for the substrate table WS which is constructed to hold a substrate W;

a source zone which includes the radiation source SO; and a projection optics zone 1 for the projection system PS configured to project the patterned radiation beam onto a target portion of the substrate.

In FIG. 4, for instance, the sealing aperture 2 extends in the interface between an optics zone 1, containing projection optics, and a substrate zone 3, configured for holding at least one substrate W. Alternatively, for example, said sealing aperture extends between a patterning device zone, comprising support means for a patterning device, and the optics zone, containing projection optics, of the apparatus.

The pumping system 20 is particularly designed and configured for removing the hydrogen and argon from respective areas of the apparatus, to prevent a certain pressure build up therein. The pumping system 20 may comprise, for instance, at least one pump, preferably at least a turbomolecular pump which is suitable for evacuating one or more relevant zones of the apparatus to relatively low pressures. In the embodiment of FIG. 4, one or more first vacuum pumps V1 are coupled to the optics zone 1, for removing gasses therefrom. Furthermore, one or more second vacuum pumps V2 are coupled to the sealing aperture 2, for removing gasses therefrom as well. The apparatus further comprises, for instance, one or more third vacuum pumps V3, for evacuating the substrate zone 3. One or more of said vacuum pumps V1, V2, V3 may also be integrated. Besides, pumping means may be applied for evacuating other regions of the apparatus. Each vacuum pump V1, V2, V3 may be coupled at various positions to a respective zone of the apparatus.

According to an aspect of the invention, said gas mixture comprises 99% to 1% argon and 1% to 99 % hydrogen. Herein, throughput is specified in mbar/sec. Good results can be obtained when said mixture comprises 79% to 39% argon and 21% to 61% hydrogen. For example, said mixture can include 69% to 49% argon and 31% to 51% hydrogen. Such a gas sealing mixture provides a surprisingly effective suppression of cross-contamination which may reach the sealing aperture 2. Besides, this gas mixture can be removed from the apparatus relatively well, for instance using one or more turbomolecular pumps. Also, the application of hydrogen in the gas mixture leads to smaller conductance losses of gas flow within the apparatus, since hydrogen has a relatively low molecular mass.

Table 3 compares a number of properties for argon and hydrogen.

TABLE 3 properties of argon and hydrogen.

| Gas | EUV absorption coefficient α (mbar · m)$^{-1}$ at λ = 13.5 nm | Diffusion constant D$_c$ (m$^2$/s), at 20° C. and 1 mbar |
| --- | --- | --- |
| Argon | 3.41 | 0.01216 |
| Hydrogen | 0.12 | 0.04549 |

The diffusion constant was calculated, following Dayton (see Dayton, B. B., Foundations of Vacuum Science and Technology, Ed. J. Lafferty, Wiley, 1998). From table 3, it follows that argon has a relatively high absorption coefficient, in case EUV radiation of a wavelength λ of 13.5 nm is used. Hydrogen has a lower absorption coefficient. Besides, argon has a lower diffusion constant than hydrogen. Following from the present invention, the above-mentioned figure of merit $1/(22.5 \cdot \alpha \cdot D_c)$ of hydrogen is higher than the same of argon, in the present example by a factor 7.4. Argon, on the other hand, can be removed more easily by vacuum pumps from the apparatus than hydrogen. Therefore, the present invention provides the use of said mixture of argon and hydrogen for purging the sealing aperture 2, which leads to a good reduction of cross-contamination between respective zones of the apparatus, wherein one or more of these zones may be maintained at relatively low vacuum pressures.

As has been shown in the embodiment of FIG. 4, said gas supply system 10 may comprise for instance at least one argon supplier comprising an argon reservoir 11, at least one hydrogen supplier comprising a hydrogen reservoir 12 and one or more supply channels 13, 15 for interconnecting said argon and hydrogen reservoir 11, 12 to the sealing aperture 2. The gas supply system may be configured, for instance, to supply a mixture containing substantially argon and hydrogen to the sealing aperture. In the present embodiment, the apparatus further comprises a gas flow controller 14, which is arranged between the argon and hydrogen suppliers 11, 12. The flow controller 14 is configured to mix suitable flows of the hydrogen and argon, and to supply the resulting hydrogen/argon mixture via a channel 15 to the sealing aperture 2. Alternatively, the gas supplying system may be configured to supply the hydrogen and argon separately to said sealing aperture 2, such that a desired hydrogen/argon mixture is formed in the aperture 2. Said gas suppliers may be configured in various other ways, as will be clear to the skilled person.

During operation, the apparatus of FIG. 3 and/or 4 may be used in a device manufacturing method comprising projecting a patterned beam of radiation onto a substrate W, wherein at least two zones 1, 3 are sealed from each other by at least one gas purged sealing aperture 2. Then, according to the invention, said sealing aperture is purged by a mixture of at least argon and hydrogen. The mixture preferably contains substantially argon and hydrogen only. For example, as follows from the above, said gas mixture can comprise 99% to 1% argon and 1% to 99% hydrogen, for example 79% to 39% argon and 21% to 61% hydrogen, particularly 69% to 49% argon and 31% to 51% hydrogen. Herein, throughput is specified in mbar/sec.

In a method according to the invention, said sealing aperture may extend at least between a substrate zone 3, configured for holding at least one substrate, and an optics zone 1, containing projection optics, of the apparatus, for preventing that contamination can reach the optics zone from the substrate zone 3. Preferably, during use, the at least one turbomolecular pump is pumping at least one of said zones and/or said sealing aperture to a certain desired or suitable pressure level. In the embodiment of FIG. 2, said hydrogen and argon are being mixed by the gas flow controller 14 before being supplied to said sealing aperture 2. Alternatively, said hydrogen and argon may be supplied separately to said sealing aperture, to form a suitable sealing gas mixture in said aperture. When the mixture is pumped by on or more turbomolecular pumps, undesired high temperatures of the rotors of the pumps can be prevented because of the use of a hydrogen/argon mixture, particularly compared to the known use of pure argon as a sealing gas. This can be explained by the relatively low thermal conductivity of argon, compared to a higher thermal conductivity of the argon/hydrogen mixture (for reference, the thermal conductivity of argon is 0.0174 W/mK while that for hydrogen is 0.175 W/mK). Besides, when pure argon would be used, ionisation effects can occur which may be damaging to optics of the apparatus. By using said mixture of argon and hydrogen, such ionisation effects can be avoided, or at least be reduced.

Preferably, the flow rate of the mixture of argon and hydrogen is in the range of about 3-100 mbar·l/min. Said flow rate is relatively high, for providing suppressing contamination flows effectively. On the other hand, said flow rate still provides for relatively low vacuum pressures in the apparatus, if desired and depending on the capacity of any installed vacuum pumping means.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm, for instance 13.5 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

For example, a gas purification system can be included, which is configured to perform a gas purification step on the argon, on the hydrogen and/or on the argon/hydrogen mixture. FIG. 4 shows schematically a gas purification system 51, being included downstream of the gas flow controller 14 to purify the hydrogen/argon mixture.

The gas supplier can be configured in various ways, and can, for example, be configured to mix a predetermined gas ratio of hydrogen and argon, and to keep a predetermined pre-set gas ratio of hydrogen and argon for a desired time period.

Besides, the gas supplier can include one or more valves 52 (see FIG. 2) or similar flow control means to control gas flows, as will be clear to the skilled person.

Also, the apparatus can include a suitable control 50, for example a computer or a controller, to control gas mixture and gas flows.

The control 50, which can be connected to the gas supply system in various ways, can be configured to control the at least one supplier to supply a mixture of at least argon and hydrogen to the sealing aperture. Such a control 50 can operate, for example, using an above-mentioned computer program, when that program has been loaded into the control.

Besides, the sealing aperture can operate at various pressure regimes, for example a pressure regime wherein flow is molecular or transitional, or in other pressure regimes, depending for example on dimensions of the sealing aperture.

What is claimed is:

1. A lithographic apparatus configured to project a pattern from a patterning device onto a substrate, the apparatus comprising:
    a gas purged sealing aperture extending between at least two different zones of the apparatus to seal the zones from each other;
    a gas supplier configured to supply the sealing aperture with one or more gases selected from a group comprising hydrogen, deuterium, heavy hydrogen, deuterated hydrogen, and a mixture of argon and hydrogen;
    a substrate zone configured to hold at least one substrate; and
    an optics zone containing projection optics,
    wherein said sealing aperture extends at least between said substrate zone and said optics zone.

2. A lithographic apparatus according to claim 1, wherein said mixture comprises 99% to 1% argon and 1% to 99% hydrogen.

3. A lithographic apparatus according to claim 1, wherein said mixture comprises 79% to 39% argon and 21% to 61% hydrogen.

4. A lithographic apparatus according to claim 1, wherein said different zones comprise:
    an illumination zone for an illumination system constructed and arranged to condition a radiation beam;
    a patterning device zone for a support constructed and arranged to support a patterning device, the patterning device being arranged to imparting the radiation beam with a pattern in its cross-section to form a patterned radiation beam; and
    a source zone including a radiation source
    wherein the optics zone includes a projection optics zone for a projection system constructed and arranged to project the patterned radiation beam onto a target portion of the substrate, and
    wherein the substrate zone is configured to include a substrate table constructed and arranged to hold at least one of the substrates.

5. A lithographic apparatus according to claim 1, further comprising a pump constructed and arranged to evacuate at least one of said zones and/or at least part of said aperture, wherein said pump comprises a turbomolecular pump.

6. A lithographic apparatus according to claim 1, wherein said gas supplier comprises a hydrogen reservoir, an argon reservoir, and a supply channel for interconnecting said hydrogen and said argon reservoir to the sealing aperture.

7. A lithographic apparatus according to claim 1, wherein said gas supplier is configured to supply a mixture containing substantially argon and hydrogen to the sealing aperture.

8. A lithographic apparatus according to claim 1, further comprising at least one fluid passage extending between at least two separate zones of the apparatus.

9. A lithographic apparatus according to claim 8, wherein said gas supplier comprises a mixer constructed and arranged to mix hydrogen and argon before the hydrogen and argon is supplied to said fluid passage.

10. A lithographic apparatus according to claim 9, wherein said gas supplier is arranged to supply the hydrogen and argon separately to said fluid passage.

11. A lithographic apparatus according to claim 1, further comprising a gas purification system constructed and arranged to purify the argon, the hydrogen and/or the argon/hydrogen mixture.

12. A lithographic apparatus according to claim 1, wherein the gas supplier is arranged to mix a predetermined gas ratio of hydrogen and argon, and/or to keep a predetermined pre-set gas ratio of hydrogen and argon for a desired time period.

13. A lithographic apparatus according to claim 1, wherein the gas supplier includes one or more valves to control one or more gas flows.

14. A lithographic apparatus according to claim 1, further comprising a control constructed and arranged to control the gas supplier to supply a mixture of at least argon and hydrogen to the sealing aperture.

15. A lithographic apparatus according to claim 1, further comprising:
    a radiation system constructed and arranged to supply a projection beam of radiation;
    a mask table constructed and arranged to hold a mask;
    a substrate table constructed and arranged to hold a substrate; and
    a projection system constructed and arranged to image an irradiated portion of the mask onto a target portion of the substrate,
    wherein:
    a) the projection system is separated from the substrate table by an intervening space which can be at least partially evacuated, said space being partially delimited at the location of the projection system by a solid surface from which the radiation is directed toward the substrate table;
    b) the intervening space contains a hollow tube located between the solid surface and the substrate table and situated around the path of the radiation, the form and size of the tube being such that radiation focused by the projection system onto the substrate table does not intercept a wall of the hollow tube; and
    c) a flushing device is provided for continually flushing the inside of the hollow tube with a flow of a gas.

16. A lithographic apparatus according to claim 15, wherein there is no member separating the intervening space from the space including the hollow tube; and wherein the hollow tube contains a region in which a flow of contaminants issuing from the substrate and a flow of the gas are opposed.

17. A lithographic apparatus according to claim 15, wherein the solid surface is a reflecting surface and the optical path from this reflecting surface to the target portion of the substrate held by the substrate table traverses only fluid.

18. A seal for a lithographic apparatus comprising a gas purged sealing aperture extending between two zones of the apparatus, wherein the seal is provided with at least one gas supplier configured to supply the sealing aperture with at least one gas from a group comprising hydrogen, heavy hydrogen, deuterium, deuterated hydrogen, and a mixture of argon and hydrogen so that the two zones of the apparatus are sealed from each other.

19. A device manufacturing method comprising:
projecting a patterned beam of radiation onto a substrate in a lithographic apparatus;
sealing at least two zones of the apparatus from each other with at least one sealing aperture; and
purging said sealing aperture with at least one gas selected from the group comprising hydrogen, helium, deuterated hydrogen, deuterium, heavy hydrogen, and a mixture of argon and hydrogen.

20. A device manufacturing method according to claim 19, wherein the flow rate of the gas is in the range of about 3-100 mbar/min.

21. A data storage medium containing one or more sequences of machine-readable instructions configured to execute a method according to claim 19.

* * * * *